US012665598B2

(12) United States Patent
  Kundur et al.

(10) Patent No.: US 12,665,598 B2
(45) Date of Patent: Jun. 23, 2026

(54) LOW LEAKAGE LEVEL SHIFTER

(71) Applicant: SKYWORKS SOLUTIONS, INC., Irvine, CA (US)

(72) Inventors: Vinay Kundur, Milpitas, CA (US); Christopher Donald Nilson, San Jose, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 15 days.

(21) Appl. No.: 18/231,839

(22) Filed: Aug. 9, 2023

(65) Prior Publication Data

US 2024/0063796 A1 Feb. 22, 2024

Related U.S. Application Data

(60) Provisional application No. 63/371,542, filed on Aug. 16, 2022.

(51) Int. Cl.
  *H03K 19/0175* (2006.01)
  *H03K 3/356* (2006.01)
  *H03K 19/003* (2006.01)
  *H03K 19/0185* (2006.01)
  *H03K 19/20* (2006.01)

(52) U.S. Cl.
  CPC ............... *H03K 19/018507* (2013.01); *H03K 3/356113* (2013.01); *H03K 19/00361* (2013.01); *H03K 19/0175* (2013.01); *H03K 19/20* (2013.01)

(58) Field of Classification Search
  CPC ....... H03K 19/0175; H03K 19/017509; H03K 19/0185; H03K 19/018507; H03K 19/018521; H03K 19/02; H03K 19/09421; H03K 19/20; H03K 3/356113; H03K 19/00361
  See application file for complete search history.

(56) References Cited

U.S. PATENT DOCUMENTS

| | | | | |
|---|---|---|---|---|
| 8,369,818 B2 * | 2/2013 | Chang | ..................... | H03F 3/195 |
| | | | | 330/252 |
| 2018/0294813 A1 * | 10/2018 | Cascio | ................. | H03K 17/102 |
| 2021/0409010 A1 * | 12/2021 | Javvaji | ........... | H03K 19/018521 |

OTHER PUBLICATIONS

Puri et al., "Minimizing Power with Flexible Voltage Islands", ISCAS, May 2005, pp. 21-24.

* cited by examiner

*Primary Examiner* — Long Nguyen
(74) *Attorney, Agent, or Firm* — Lando & Anastasi, LLP

(57) ABSTRACT

A level shifter having: an input configured to receive an input signal, an output configured to provide an output signal, a voltage rail configured to provide a rail voltage, at least two diodes including a first and second diode connected in series between the voltage rail and the input, at least three switches, and a capacitor. The at least three switches include a first switch coupled between the voltage rail and the output of the first diode, a second switch coupled between the voltage rail and the output of the second diode, and a third switch coupled between the voltage rail and the input. The capacitor is coupled between the output of the second diode and ground.

19 Claims, 3 Drawing Sheets

<u>FIG.1</u>
<u>Prior Art</u>

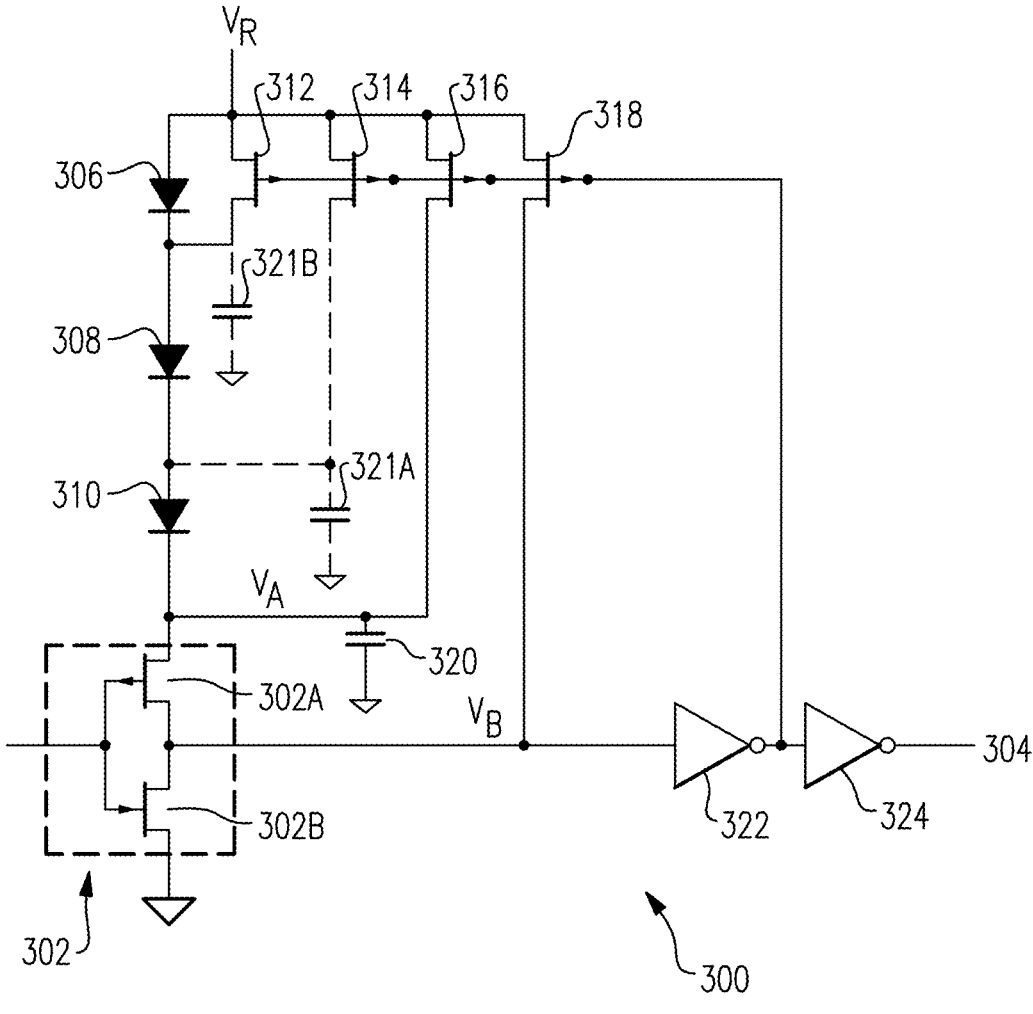
<u>FIG.3</u>

LOW LEAKAGE LEVEL SHIFTER

CROSS-REFERENCE TO RELATED APPLICATIONS

This application claims priority under 35 U.S.C. § 119(e) to U.S. Provisional Patent Application Ser. No. 63/371,542, titled "LOW LEAKAGE LEVEL SHIFTER," filed Aug. 16, 2022, the entire content of which is incorporated herein by reference in its entirety for all purposes.

BACKGROUND

1. Field of the Disclosure

At least one example in accordance with the present disclosure relates generally to level shifters for use in electronic devices.

2. Discussion of Related Art

Level shifters are a class of circuit used to select an output voltage based on an input voltage. Level shifters are generally used where a guaranteed voltage is required for a circuit, and may act as intermediaries between the output of a first circuit and the input of a second circuit, the first circuit outputting an otherwise unsuitable voltage for use in the second circuit.

SUMMARY

According to at least one aspect of the present disclosure a level shifter is provided. The level shifter comprises an input configured to receive an input signal, an output configured to provide an output signal, a voltage rail configured to provide a rail voltage, at least two diodes including a first diode and a second diode connected in series between the voltage rail and the input, at least three switches, and a capacitor. The at least three switches includes a first switch, a second switch, and a third switch. The first switch is coupled between the voltage rail and an output of the first diode, the second switch is coupled between the voltage rail and an output of the second diode, and the third switch is coupled between the voltage rail and the input. The capacitor is coupled between the output of the second diode and ground.

In some examples, the diodes are transistors having their respective sources shorted to their respective gates. In various examples, the level shifter further comprises a first inverter coupled to the input. In many examples, an output of the first inverter is coupled to a gate of each of the three switches. In some examples, the level shifter further comprises a second inverter coupled to the output of the first inverter. In various examples the at least two diodes further include one or more additional diodes, each additional diode connected in series between the output of the first diode and the input of the second diode.

In various examples the at least three switches include one or more additional switches, each respective additional switch coupled between the voltage rail and an output of a respective additional diode of the one or more additional diodes. In some examples, the level shifter further comprises a plurality of additional capacitors, each respective additional capacitor coupled between an output of a respective additional diode and ground.

In some examples, the output of the first inverter is coupled to the gates of the one or more additional diodes. In various examples, the input comprises at least two transistors coupled in series between the output of the second diode and ground. In many examples, the level shifter has at least two states including a first state corresponding to providing an output signal at the output and a second state corresponding to not providing an output signal at the output.

According to at least one aspect of the present disclosure, a level shifter is provided, the level shifter comprising an input; an output; a first node configured to provide a voltage; a plurality of current-blocking circuit elements configured to allow current to pass from the first node to the input but not from the input to the first node; a plurality of switches coupled to the first node; and a capacitor coupled to the plurality of current-block circuit elements and the input.

In some examples, the current-block circuit elements of the plurality of current blocking circuit elements are diodes. In some examples, the current-block circuit elements of the plurality of current blocking circuit elements are transistors configured to operate as diodes. In some examples, a switch of the plurality of switches is further coupled to a current-blocking circuit element of the plurality of current-blocking circuit elements at a node other than the first node. In some examples, the plurality of switches further includes at least one switch from a set including: a first switch coupled to the first node and to a first current-blocking circuit element of the plurality of current-blocking circuit elements at a node other than the first node; a second switch coupled to the first node and to a second current-blocking circuit element of the plurality of current-blocking circuit elements, the second current-blocking circuit element being coupled to the first current-blocking circuit element; a third switch coupled to the first node and to a third current-blocking circuit element of the plurality of current-blocking circuit elements, the third current-blocking circuit element being coupled to the second current-blocking circuit element; and a fourth switch coupled at a first connection to the first node, and at a second connection between the input and the output. In some examples, each switch of the plurality of switches is coupled to a respective capacitor. In some examples, the level shifter further comprises a first inverter coupled to the input; and a second inverter coupled between the first inverter and the output. In some examples, the first inverter is coupled to a respective control input of each switch, the respective control input of each respective switch being configured to control a respective state of each respective switch.

According to at least one aspect of the present disclosure, a level shifter is provided, the level shifter comprising an input; and output; a first inverter having a first inverter input and a first inverter output; a second inverter having a second inverter input and a second inverter output, the first inverter coupled to the input via the first inverter input and coupled to the second inverter input via the first inverter output, the second inverter coupled to the output via the second inverter output; a plurality of diodes coupled between a voltage rail and the input; a capacitor coupled between the input and ground; and a plurality of switching devices coupled to at least the voltage rail, each respective control input for each respective switching device of the plurality of switching devices being coupled to the first inverter via the first inverter output.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 3 illustrates a level shifter according to an example.

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Level shifters are used to shift from one voltage level to another voltage level. Level shifters are often used when a device requires a specific voltage level or voltage range to operate correctly. For example, a circuit may require a 5V input, but the input signal may not be 5V. The level shifter is then used to transform the input voltage to the desired voltage or voltage range.

Figure 1:
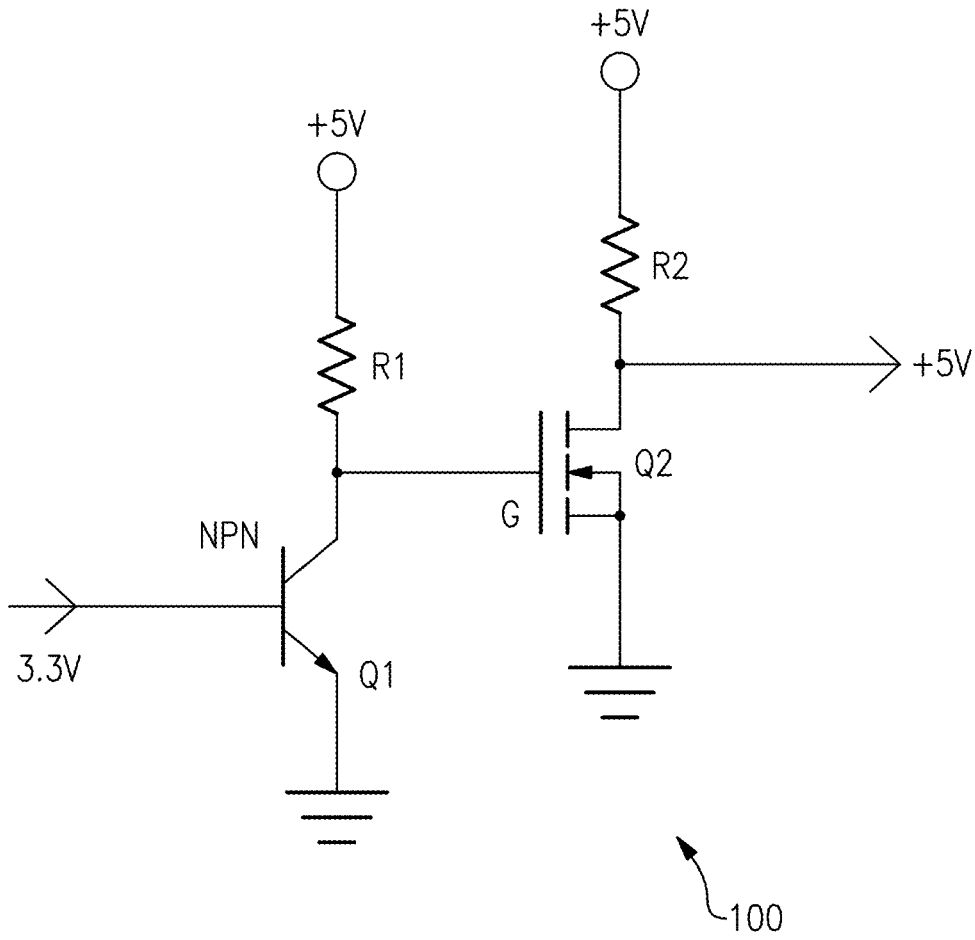
FIG. 1 illustrates a prior art inverting level shifter.

FIG. 1 illustrates a simple, well-known level shifter topology for an inverting level selector 100. The inverting level selector 100 of FIG. 1 includes an NPN transistor Q1, a PNP transistor Q2, resistors R1 and R2, a 3.3V input, a 5V rail, and an output. When the 3.3V input signal is provided, Q1 is conducting, and pulls the voltage at the gate of Q2 down to zero. Since Q2 is a PNP transistor, it is on, and pulls the voltage at the output down to zero. Thus, a 3.3V input is used to select a 0V output. Likewise, when the input to the gate of Q1 is 0V, Q1 is open and not conducting. Therefore, the voltage at the gate of Q2 is 5V. The 5V input to Q2 opens Q2, preventing Q2 from conducting. Therefore, the voltage at the output is 5V. Thus, a 0V input is used to select a 5V output. In summary, FIG. 1 selects between a 0V and 5V output depending on the value of the input signal.

However, the inverting level selector 100 suffers from substantial disadvantages. For instance, the timing characteristics of the inverting level selector 100 may be poor, and there may be substantial leakage current throughout. The present disclosure improves on the prior art by providing a low leakage level shifter with good timing characteristics and low leakage current.

Figure 2:
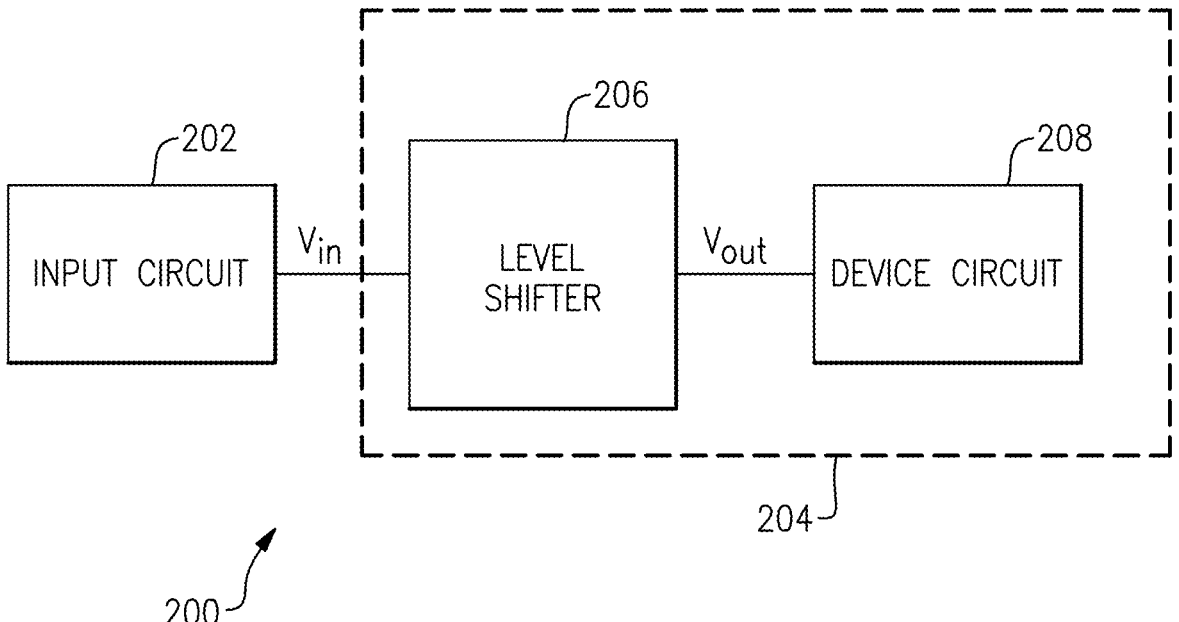
FIG. 2 illustrates a block diagram of an electronic device with a level shifter according to an example.

FIG. 2 illustrates a level shifting system 200 according to an example. The level shifting system 200 illustrates how a level shifter 206 may be used to control a circuit. The level shifting system includes an input circuit 202 and an electronic device 204 including a level shifter 206, and a device circuit 208. Also shown are voltage $V_{in}$ and $V_{out}$.

The input circuit 202 is coupled to the electronic device 204 via the level shifter 206. The level shifter is coupled to the device circuit 208. The input circuit 202 provides the voltage $V_{in}$ to the level shifter 206. The level shifter 206 then uses the voltage $V_{in}$ to select an output voltage $V_{out}$. The level shifter 206 provides the voltage $V_{out}$ to the device circuit 208.

In some examples, the level shifter 206 and device circuit 208 share power rails common to the electronic device 204. In some examples, the input circuit 202 does not share power rails in common with the electronic device 204. As a result, the voltage $V_{in}$ may depend on the power rails of the input circuit 202, while the voltage $V_{out}$ may depend on the power rails of the electronic device 204. In some examples, $V_{in}$ may not be suitable for use and/or to power either the level shifter 206 or the device circuit 208, or any other parts of the electronic device 204. Instead, the voltage $V_{in}$ may be used as a control to switch the level shifter 206 on or off. Thus, the value of $V_{in}$ determines whether $V_{out}$ is provided to the device circuit 208 or not.

The level shifter 206 may be configured such that $V_{in}$ must have a minimum magnitude to trigger the level shifter 206 to provide $V_{out}$ to the device circuit 208. For example, the level shifter 206 may be off (or on) if $V_{in}$ is less than a given voltage, and the level shifter 206 be on (or off) if $V_{in}$ is greater than the given voltage. The level shifter 206 may therefore be configured to detect voltage levels of $V_{in}$, or to detect voltage ranges of $V_{in}$ corresponding to providing or not providing $V_{out}$ to the device circuit 208. As a result, the level shifter 206 may have at least two operation states corresponding to whether it is outputting $V_{out}$ or not.

FIG. 3 illustrates one example of a low leakage level shifter (LS) 300 according to aspects of the present disclosure. LS 300 is configured to use a reduced amount of power for level detection, while also accurately and robustly detecting input voltage levels corresponding to high and low levels. LS 300 may be used, for example, as the input to a microcontroller or other circuit, controlling whether the microcontroller or other circuit is on or off.

LS 300, as shown, includes an input 302, an output 304, a plurality of diodes connected in series, including a first diode 306, an optional at least one intermediary diode 308, and a second diode 310. The input 302 may include a first transistor 302A and a second transistor 302B, which may be p-type and n-type, respectively. In some examples, the first transistor 302A is of a different type than the second transistor 302B. LS 300 also includes a plurality of switches including first switch 312, an optional at least one intermediary switch 314, a second switch 316, and a third switch 318. In some examples the switches 312, 314, 316, 318 are transistors having the same type (all p-type or all n-type, for example). LS 300 includes a capacitor 320, a first inverter 322, and a second inverter 324. Also shown in the figure is an equipotential reference node (i.e., ground) connected to the capacitor 320, a level shifter rail voltage $V_R$, a voltage $V_A$, and a voltage $V_B$. As shown in the drawings, each switch 312, 314, 316, 316, is a p-type transistor. Furthermore, each inverter 322, 324, is connected to a respective supply rail and ground rail (not shown). In at least some examples, the supply rail for each inverter 322, 324 is connected to $V_R$.

The diodes 306, 308, 310 are connected in series between $V_R$ and the input 302 and/or $V_A$. In some examples, the diodes 306, 308, 310 are connected such that each diode's anode is connected on the $V_R$ side and each diode's cathode is connected on the input 302 side. The first switch 312 is coupled between $V_R$ and the cathode of the first diode 306. The second switch 316 is coupled between $V_R$ and the cathode of the second diode 310. The third switch 318 is coupled between $V_R$ and $V_B$. Each respective intermediary switch of the optional at least one intermediary switch 314 is coupled between $V_R$ and the cathode of a respective intermediary diode of the optional at least one intermediary diode 308. With respect to the switches 312, 314, 316, 318, in some examples each switches' source is coupled to $V_R$ and each switches' drain is coupled to the cathode of the respective diode 306, 308, 310. In other examples, each switches drain is coupled to $V_R$ and each switches' source is coupled to the cathode of the respective diode 306, 308, 310.

The capacitor 320 is coupled between $V_A$ and ground. The input 302 is coupled to $V_A$ and $V_B$. The first transistor 302A is coupled in series to the second transistor 302B. The gates of the first and second transistors 302A, 302B are connected to the input of the level shifter, while the node at which the first and second transistors 302A, 302B are coupled together is further coupled to $V_B$. The input of the first inverter 322 is coupled to $V_B$, and the output of the first inverter 322 is coupled to the second inverter 324 and the gates of the switches 312, 314, 316, 318. The second inverter 324 is coupled to the output 304, and the output 304 is configured to couple to any circuit.

LS 300 has at least two states, an on state where inverter 324 provides a high output value, and an off state where inverter 324 provides a low output value (zero, ground, etc). These two states are described in greater detail below (and are referred to as the "on" and "off" states, respectively). LS 300 receives an input signal at the input 302. Depending on the value of the input signal, the circuit will either output a selected voltage at the output 304 or the LS 300 will not. Whether the LS 300 outputs a selected voltage or not determines the state of the LS 300.

When the input 302 receives an input signal with a high value, LS 300 is in the "off" state. The first transistor 302A is open (not conducting) and transistor 302B is closed (conducting). Transistor 302B is connected to ground, and so $V_B$ is pulled down to a low value, such as ground. Accordingly, the first inverter 322 provides a high output signal to each of the switches 312, 314, 316, 318, and to the second inverter 324. Because the input to the second inverter 324 is high, the second inverter 324 provides a low output signal to the output 304. Each of the switches 312, 314, 316, 318, is open and not conducting because the input at each of their respective gates is high. Accordingly, no current flows across any of the switches 312, 314, 316, 318. As a result, the voltage $V_A$ equals $V_R$ minus the total voltage drop across the diodes 306, 308, 310. For example, if each diode 306, 308, 310 has a voltage drop of 0.7V, and $V_R$ equals 5V, then $V_A=5-3\times0.7=2.9V$. The diodes 308, 310 reduce leakage current when the input signal is high by reducing the voltage at $V_A$ and thus reducing leakage current flowing through the first transistor 302A.

When LS300 receives an input signal at input 302 with a low value, then the first transistor 302A is closed (conducting) and the second transistor 302B is open (not conducting). In this case, $V_B$ is pulled up to equal $V_A$. The first inverter 322 receives a high input, and thus provides a low output. The second inverter 324 receives a low input from the first inverter 322, and thus provides a high output signal to the output 304. Furthermore, since each switch 312, 314, 316, 318 receives no input at each of their respective gates, each is closed (conducting). Thus, the voltage at $V_A$ is pulled up to equal the voltage at $V_R$. Furthermore, no current flows across any of the diodes 306, 308, 310 because each diode is shorted due to each switch 312, 314, 316, 318 being closed.

LS 300 switches between the outputting and off states according to conditions existing in the circuit. In some examples, when the input signal at the input 302 changes from low to high (such as from logical low to logical high, e.g., 0 to 1), the state of LS 300 changes from on to off. As the input signal begins to increase, the resistance of the second transistor 302B begins to decrease. When the resistance of the second transistor 302B is less than the resistance of the first transistor 302A in parallel with the third switch 318, and $V_B$ reaches the activation threshold for the first inverter 322, then the first inverter 322 changes state and begins to output a signal. The following equations show the conditions described above, where $R_1$ indicates the resistance of the first transistor 302A, $R_2$ indicates the resistance of the second transistor 302B, $R_3$ indicates the resistance of the third switch 318, and $V_{inv}$ indicates the activation threshold voltage of the inverter 322.

$$R_2 \leq R_1 \| R_3$$

$$V_B \leq V_{inv}$$

The precise value at which LS 300 "trips" from one state to another when the input signal is increasing depends at least in part on the first and second transistors 302A, 302B, the third switch 318, and the electrical characteristics of the first inverter 322. In some examples, the relative transconductance of the first and second transistors 302A, 302B, and the third switch 318 will determine the "trip" point. It will also be appreciated that $V_B$ may be less than or equal to the activation threshold of the first inverter 322 for the first inverter 322 to turn on, however, $V_B$ may also be less than the activation threshold.

In some examples, when the input signal at the input 302 changes from high to low (such as from logical high to logical low, e.g., 1 to 0), the state of the LS 300 changes from off toon. As the voltage of the input signal, $V_{in}$, begins to decrease, the resistance of the second transistor 302B begins to increase and the first transistor 302A begins to conduct. In some examples, when the absolute value of $V_{in}$ minus the $V_A$ is greater than a threshold voltage, $V_{th}$, of the first transistor 302A, and $V_{in}$ is less than the threshold voltage, $V_{th}$, of the first transistor 302A, then the circuit will trip and change state. The following two equations show the conditions described above, where $V_{th}$ is the threshold voltage of the first transistor 302A:

$$|V_{in}-V_A|>V_{th}$$

$$V_{in}<V_{th}$$

The trip point, in some examples, may depend on the threshold voltage ($V_{th}$) of each of the first and second transistors 302A, 302B, as well as the electrical characteristics of the diodes 306, 308, 310.

However, it will be appreciated that each diode 306, 308, 310 increases delay in the circuit when the input switches between high and low because of the low transconductance of the switches 312, 314, 316, 318. To improve the timing characteristics of the circuit the capacitor 320 is connected to $V_A$ such that, during transient operation of the circuit following changes in the input signal, the capacitor 320 acts as an AC ground. During transient operation of LS 300, current may pass through capacitor 320 to ground, rather than flowing through the input 302 or other circuit components. As a result, energy stored in LS 300 is drained more quickly than it would be without the capacitor 320, allowing the circuit to switch from transient to steady state more quickly. During steady state operation, the capacitor 320 acts as an open circuit (not conducting).

The capacitor 320 may have an area associated with it. The area of the capacitor 320 may be the surface area of the capacitive plate of the capacitor (that is, the surface area of the conductor that would be used to calculate capacitance according to known methods). For example, if capacitor 320 is a transistor with source and drain shorted together, the area may be the gate area of the transistor. In some examples, when the area of the capacitor 320 is greater than the sum of the gate areas of the transistors that are charged from high to low, then during transition $V_A$ acts like an AC short across the capacitor 320. When capacitor 320 is utilized as an AC short, the delays associated with the shifter may be some orders of magnitude lower than if the capacitor 320 was not utilized as an AC short. For example, with the capacitor utilized as an AC short, delays may be 1.6 nanoseconds, while without the capacitor utilized as an AC short, delays may be approximately 100 nanoseconds.

It will also be appreciated that each diode 306, 308, 310 may be made from a transistor, for example, provided the transistor's gate is shorted to one of either the transistor's drain or source. The capacitor 320 may be made from a transistor with its gate connected to VA and its drain and source shorted together and/or to ground. It will also be appreciated that, for each intermediary switch 314 and intermediary diode 308 added to the circuit, an additional capacitor may be added to the nodes connecting the intermediary switch 314 and intermediary diode 308. In some examples, these additional capacitors will have capacitance equal to that of capacitor 320. The capacitors 321A and 321B are examples of additional capacitors that may be added as described above. Furthermore, in at least some examples, the circuit does not include the optional intermediary diodes 308 and corresponding intermediary switches 314.

It will be appreciated that, in some examples, the input signal changes value slowly and/or swings between a maximum and minimum value. In some example, the voltage of the input signal may swing between any values. For example, 0 to 1.5 V may correspond to a low input, and values above 1.5 V may correspond to a high input, and the voltage of the input signal may swing between 0 and 2 V. There may also be a gap between low and high inputs. For example, the voltage range of the input signal corresponding to a low input may be 0 to 2 V, while the voltage range of the input signal corresponding to a high input may be 2.3 V and above, indicating a gap between the high (2.3 V) and low (2 V) input of 0.3 V. However, the gap may be any value (0 V, 0.001 V, 0.01 V, 0.1 V, and so forth). The voltage $V_R$ may also be any suitable voltage, for example 2.3 V, 3.2 V, 4.1 V, 5 V, and so forth. The level shifter 300 may have low static current, for example, less than 550 nA even in the worst case.

In accordance with the disclosure herein, low leakage level shifters may be implemented in various electronic devices. Examples of electronic devices include consumer electronic products like cellphones, headphones, earbuds, and so forth. Electronic devices may be low or high power devices, and may be implemented using semiconductor die components and/or package modules.

Individual components of the examples herein may be implemented using any appropriate method. For example, transistors may be MOSFET, BJT, Gallium Nitride (GaN), and so forth. Diodes may be of any type, for example, Schottky, varactors, Zener, junction diodes, and so on. Inverters mentioned herein may be implemented using any circuit topology, including CMOS, NMOS, PMOS topologies, and so forth.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A level shifter comprising:
   an input connection configured to receive an input signal;
   an output connection configured to provide an output signal;
   a voltage rail configured to provide a rail voltage;
   at least two diodes including a first diode and a second diode connected in series between the voltage rail and the input connection;
   at least three switches including a first switch, a second switch, and a third switch, the first switch being coupled between the voltage rail and an output of the first diode, the second switch coupled between the voltage rail and an output of the second diode, and the third switch coupled between the voltage rail and the input connection; and
   a capacitor coupled between the output of the second diode and ground.

2. The level shifter of claim 1 wherein the at least two diodes are transistors having their respective sources shorted to their respective gates.

3. The level shifter of claim 1 further comprising a first inverter coupled to the input connection.

4. The level shifter of claim 3 wherein an output of the first inverter is coupled to a gate of each of the at least three switches.

5. The level shifter of claim 4 further comprising a second inverter coupled to the output of the first inverter.

6. The level shifter of claim 5 wherein the at least two diodes further include one or more additional diodes, each additional diode connected in series between the output of the first diode and the input of the second diode.

7. The level shifter of claim 6 wherein the at least three switches include one or more additional switches, each respective additional switch coupled between the voltage rail and an output of a respective additional diode of the one or more additional diodes.

8. The level shifter of claim 7 further comprising a plurality of additional capacitors, each respective additional capacitor coupled between an output of a respective additional diode and ground.

9. The level shifter of claim 7 wherein the output of the first inverter is coupled to the gates of the one or more additional switches.

10. The level shifter of claim 1 wherein the input connection comprises at least two transistors coupled in series between the output of the second diode and ground.

11. The level shifter of claim 1 wherein the level shifter has at least two states including a first state corresponding to providing the output signal at the output connection and a second state corresponding to not providing the output signal at the output connection.

12. A level shifter comprising:

an input connection;

an output connection;

a first node configured to provide a voltage;

a plurality of current-blocking circuit elements configured to allow current to pass from the first node to the input connection but not from the input connection to the first node, the plurality of current-blocking circuit elements being coupled in series with respect to each other between the input connection and the first node;

a plurality of switches, each switch of the plurality of switches having a respective first terminal directly coupled to the first node, and each current-blocking circuit element of the plurality of current-blocking circuit elements having at least one terminal coupled directly to a respective second terminal of one respective switch of the plurality of switches; and a capacitor coupled to the plurality of current-blocking circuit elements and the input connection.

13. The level shifter of claim 12 wherein the plurality of current-blocking circuit elements are diodes.

14. The level shifter of claim 12 wherein the plurality of current blocking circuit elements are transistors configured to operate as diodes.

15. The level shifter of claim 12 wherein the plurality of switches includes:

a first switch coupled to the first node and to a first current-blocking circuit element of the plurality of current-blocking circuit elements at a node other than the first node;

a second switch coupled to the first node and to a second current-blocking circuit element of the plurality of current-blocking circuit elements, the second current-blocking circuit element being coupled to the first current-blocking circuit element; and a third switch coupled to the first node and to a third current-blocking circuit element of the plurality of current-blocking circuit elements, the third current-blocking circuit element being coupled to the second current-blocking circuit element.

16. The level shifter of claim 12 wherein the level shifter includes a plurality of capacitors, the plurality of capacitors including the capacitor, wherein each respective switch of the plurality of switches is coupled to a respective capacitor of the plurality of capacitors.

17. The level shifter of claim 12 further comprising:

a first inverter coupled to the input connection; and a second inverter coupled between the first inverter and the output connection.

18. The level shifter of claim 17 wherein the first inverter is coupled to a respective control input of each switch of the plurality of switches, the respective control input of each respective switch being configured to control a respective state of each respective switch of the plurality of switches.

19. A level shifter comprising:

an input connection;

and output connection;

a first inverter having a first inverter input and a first inverter output;

a second inverter having a second inverter input and a second inverter output, the first inverter coupled to the input connection via the first inverter input and coupled to the second inverter input via the first inverter output, the second inverter coupled to the output connection via the second inverter output;

a plurality of diodes coupled between a voltage rail and the input connection;

a capacitor coupled between the input connection and ground; and a plurality of switching devices coupled to the voltage rail, each respective control input for each respective switching device of the plurality of switching devices being coupled to the first inverter via the first inverter output.

\* \* \* \* \*